United States Patent
Bowles et al.

(10) Patent No.: US 9,018,029 B1
(45) Date of Patent: Apr. 28, 2015

(54) VENT HOLE SEALING IN MULTIPLE DIE SENSOR DEVICE

(71) Applicants: Philip H. Bowles, Gilbert, AZ (US);
Paige M. Holm, Phoenix, AZ (US);
Stephen R. Hooper, Mesa, AZ (US);
Lianjun Liu, Chandler, AZ (US);
Raymond M. Roop, Paradise Valley, AZ (US)

(72) Inventors: Philip H. Bowles, Gilbert, AZ (US);
Paige M. Holm, Phoenix, AZ (US);
Stephen R. Hooper, Mesa, AZ (US);
Lianjun Liu, Chandler, AZ (US);
Raymond M. Roop, Paradise Valley, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/099,502

(22) Filed: Dec. 6, 2013

(51) Int. Cl.
*B81B 7/02* (2006.01)
*B81C 1/00* (2006.01)

(52) U.S. Cl.
CPC .............. *B81B 7/02* (2013.01); *B81C 1/00293* (2013.01); *B81B 2201/0235* (2013.01); *B81B 2201/0242* (2013.01)

(58) Field of Classification Search
CPC ....... H01L 23/10; H01L 23/26; H01L 23/564; H01L 23/08; B81B 7/0077; B81C 1/00293
USPC .......... 257/682, 684, 723, E23.128, E23.18, 257/E23.181, 415–417; 438/51
See application file for complete search history.

(56) References Cited

U.S. PATENT DOCUMENTS

| | | | |
|---|---|---|---|
| 7,327,004 B2 * | 2/2008 | Hattori et al. | 257/415 |
| 8,035,209 B2 | 10/2011 | Gonska et al. | |
| 8,043,897 B2 * | 10/2011 | Lee et al. | 438/113 |
| 8,250,921 B2 | 8/2012 | Nasiri et al. | |
| 2005/0001561 A1 * | 1/2005 | Sumarokov et al. | 315/266 |
| 2009/0101998 A1 * | 4/2009 | Yen et al. | 257/416 |
| 2012/0212925 A1 | 8/2012 | Zoellin et al. | |
| 2014/0374917 A1 * | 12/2014 | Weber et al. | 257/774 |

FOREIGN PATENT DOCUMENTS

CN 101643193 2/2010

* cited by examiner

*Primary Examiner* — Mamadou Diallo
*Assistant Examiner* — Christina Sylvia
(74) *Attorney, Agent, or Firm* — Lempia Summerfield Katz LLC

(57) ABSTRACT

Embodiments of methods of fabricating a sensor device include attaching first and second die to one another to define first and second cavities in which first and second sensors of the sensor device are disposed, respectively. The second die has an opening in communication with the second cavity. The methods further include obstructing the opening, attaching a third die to the second die. The first cavity is hermetically sealed by attaching the first and second die. The second cavity is hermetically sealed by attaching the third die to the second die.

20 Claims, 3 Drawing Sheets

VENT HOLE SEALING IN MULTIPLE DIE SENSOR DEVICE

FIELD OF INVENTION

The present embodiments relate to semiconductor devices, microelectromechanical system (MEMS) sensor devices, and methods of their fabrication.

BACKGROUND

Microelectromechanical system (MEMS) sensor devices often present packaging challenges. For instance, MEMS sensors are typically sealed to perform properly over time. The sealing provides protection from corrosive elements and other harsh operating environments, such as, for example, those presented in an automotive application. The sealing also helps ensure relatively high reliability over the lifetime of the device. For example, with some types of MEMS accelerometers, it is desirable to seal the MEMS accelerometer in a chamber to prevent contamination of the moving parts of the MEMS accelerometer during subsequent processes. In another example, micro-gyroscopes are packaged in a hermetically sealed cavity or enclosure to operate at a known pressure level, typically a pressure level near vacuum, e.g., less than 0.5 torr. Additional packaging challenges arise when the sealed cavity for the MEMS sensor is assembled with an integrated circuit, such as an application-specific integrated circuit (ASIC), designed to control and communicate with the MEMS sensor.

Combining different types of MEMS sensors together on a single die can present further challenges. One combination involves MEMS accelerometers and MEMS gyroscopes. MEMS accelerometer performance improves with damping from gas in the cavity, whereas the MEMS gyroscope operates best undamped. The operating environment of a MEMS accelerometer is accordingly at a much higher pressure level, e.g., near atmospheric pressure, than the near vacuum levels for the MEMS gyroscope. So using a common pressure for the accelerometer and gyroscope devices thus presents performance and/or design tradeoffs. The alternative, providing dual pressures in a single die, presents a considerable technical challenge.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
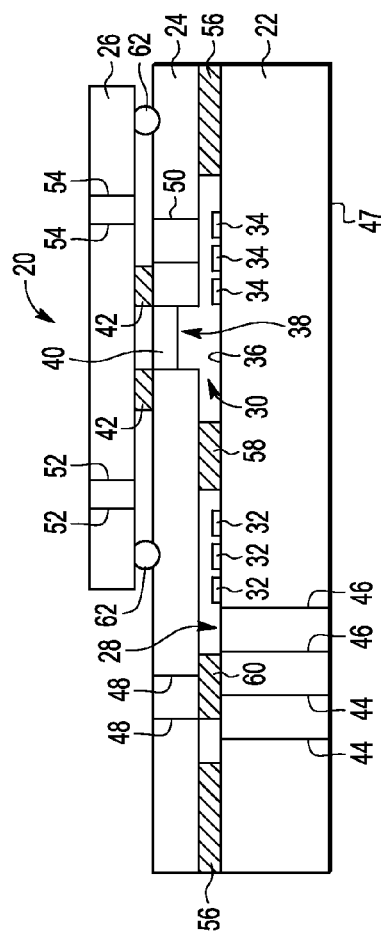
FIG. 1 is a schematic, simplified, cross-sectional view of a sensor device having an obstructed plugged vent hole in accordance with one embodiment.

Sensor device fabrication methods in which obstructed openings, or vent holes, are described. Sensor devices fabricated in accordance with the fabrication methods are also described. The openings may be plugged, covered, blocked, or otherwise obstructed to protect a device cavity during fabrication and/or assembly. The openings are directed to achieving different pressure levels for a sensor device having multiple sensors, e.g., on a single die. The different pressure levels are established in respective cavities of the sensor device. The vent holes are plugged or otherwise sealed or obstructed to protect the sensor in the cavity in communication with the vent hole. The obstruction may be semi-hermetic or non-hermetic. The obstruction may provide a temporary, interim, or initial seal that protects the sensor through a number of fabrication and/or assembly procedures. The protection is useful until a second, hermetic seal is provided for the cavity in communication with the vent hole through an attachment, e.g., flip-chip attachment, of a die.

The disclosed embodiments may be useful in achieving a vacuum, e.g., high or medium vacuum, in a cavity having a gyroscope sensor, and a pressure level at or near atmospheric pressure in a cavity having an accelerometer. Other pressure levels and pressure level differences may be established. Because of the obstruction of the vent hole, the difference in pressure levels may be obtained despite assembly of a die stack that occurs outside of a clean room, e.g., at a package assembly facility.

The disclosed embodiments are useful in achieving a multiple die sensor device with a small footprint or size. The footprint of the sensor device may be reduced by disposing multiple sensor types on a common die of the sensor device. The sensors may be arranged side by side. Although described in connection with embodiments having different sensors on the same die, the disclosed embodiments may be useful in connection sensor devices having multiple types of sensors disposed on different die.

Although described below in connection with several MEMS sensor device examples, the disclosed embodiments may be useful in connection with various types of sensors. For example, the sensors of the disclosed embodiments may include sensors other than accelerometers or other sensors directed to detecting linear acceleration. The sensors also may include sensors other than gyroscopes or other sensors directed to detecting rotation, e.g., rotational orientation or acceleration. Additional or alternative devices may be integrated into the sensors of the disclosed embodiments. For example, pressure sensors and/or magnetic field sensors may be included. The disclosed embodiments are also not limited to MEMS devices. The number of sensors or sensor types may also vary. For instance, sensors of each type may be provided for detection along or in connection with a desired number of axes and desired levels of sensitivity.

The disclosed embodiments are compatible with various packaging technologies and processes. For example, the sensor devices may, but need not, be deployed in chip-scale packaging arrangements. The opening may be plugged or otherwise obstructed during fabrication in preparation for hermetic sealing via various packaging at assembly. The sensor devices may be subsequently attached to a circuit board using various solders, such as tin-lead (SnPb) eutectic solder and Pb-free solders. Non-wafer level packaging techniques may be used, including, for instance, various wire bonding techniques. The sensors of the disclosed embodiments may be overmolded and deployed in accordance with surface mount technologies, such as quad flat no leads (QFN) packaging and land grid array (LGA) packaging. The sensors may be mounted in other types of packages. For example, the sensors may be packaged as a small outline integrated circuit (SOIC).

Regardless of the packaging technology, the methods of the disclosed embodiments may be used to fabricate smaller sensor devices. The disclosed sensor devices may integrate multiple types of sensors in a single package. The footprint of the sensor devices may thus be smaller than, for instance, non-integrated sensor devices. For example, the footprint of the packaged sensor device may be about 3 millimeter (mm) by about 3 mm for sensors configured to sense three axes of linear acceleration and three axes of rotation. The footprint may have larger and/or smaller dimensions, as well. The thickness of the sensor devices may also be minimal despite the wafer stacking of the disclosed embodiments. In some examples, the thickness of the packaged sensor device may be about 0.6 mm or less. The thickness may be larger, as well. Such thicknesses may be achieved whether solder bumps are added for chip-scale packaging or whether the sensor device is overmolded.

FIG. 1 is a cross-sectional view of a sensor device 20 that includes a set of die attached in a stacked arrangement. Each die may correspond with a substrate on and/or in which device elements are formed. The die stack arrangement may be formed by dicing wafers attached using wafer-level bonding techniques. The cross-sectional view may be taken along lines 1-1 of FIG. 2. The arrangement may include fewer, additional, or alternative die. For example, the arrangement may include an additional die to provide a number of magnetic sensors.

In this embodiment, the sensor device 20 includes a sensor die 22, a cap die 24 attached to the sensor die 22, and an application-specific integrated circuit (ASIC) die 26 attached to the cap die 24. The sensor die 22, the cap die 24, and the ASIC die 26 may be bonded to one another as described herein. The attachment of the sensor die 22 and the cap substrate 24 define a first cavity 28 and a second cavity 30. One or more sensors 32 of a first sensor type, such as a gyroscope, are disposed in the first cavity 28. One or more sensors 34 of a second sensor type, such as an accelerometer, are disposed in the second cavity 30. The first and second sensors 32, 34 may be other types of sensors. In this example, three gyroscope sensors 32 are disposed in the first cavity 28 and configured for sensing rotation about three axes (e.g., three orthogonal axes). Three accelerometer sensors 34 are disposed in the second cavity 30 and configured for sensing acceleration along three axes (e.g., three orthogonal axes). Additional, fewer, or alternative sensors may be provided. For example, in other cases, different sensor types are disposed in the same cavities.

In the embodiment of FIG. 1, the first and second sensors 32, 34 are disposed on the sensor die 22. In other embodiments, the first and second sensors 32, 34 are disposed on the cap die 24. In other words, the sensor and cap die 22, 24 may be reversed. The first and second sensors 32, 34 may be disposed in a side-by-side arrangement on a common or same side 36 of the sensor die 22. In other embodiments, one or both of the sensors 32, 34 may be disposed on the cap die 24.

The cap die 24 has an opening 38 in communication with the second cavity 30. The opening 38 may provide a vent hole or path through the cap die 24. The opening 38 allows the pressure level in the second cavity 30 to be established after the attachment of the sensor die 22 and the cap die 24. In contrast, the pressure level of the first cavity 28 is established with the attachment of the sensor die 22 and the cap die 24, insofar as the first cavity 28 is hermetically sealed by the attachment. The vent path may be established during fabrication before or after the first die 22 is attached to the cap die 24. Without the opening 38, the second cavity 30 would have the same pressure level as the first cavity 28. With the opening 38, the pressure level of the second cavity 30 may be at a level, e.g., an atmospheric pressure level, desirable for the sensor, e.g., accelerometer, disposed in the second cavity 30.

The opening 38 allows the gas in the second cavity 30 to be at a pressure higher than the pressure of the first cavity 28. The pressure of the first cavity 28 may be lower than the pressure in the second cavity 30, such as a near vacuum level, to support the operation of the gyroscope sensors 32 disposed therein. A near vacuum pressure level in the first cavity 28 may be useful for efficiently driving the gyroscope sensors 32 during operation. The cap die 24 is attached in a fabrication environment at the near vacuum pressure level or other desired level.

The sensors 34, such as accelerometers, in the second cavity 30 may be well suited for operation at a pressure level other than the pressure level in the first cavity 28 (e.g., the near vacuum pressure level) for the gyroscope sensors 32. The higher pressure level of the second cavity 34 may be useful for damping the accelerometer sensors 34 during operation.

The sensors 34 in the second cavity 30 are protected by an obstruction 40 disposed relative to the opening 38 to obstruct the opening 38. The obstruction 40 prevents contaminants from entering the second cavity 30 during subsequent fabrication and/or assembly procedures. The obstruction 40 may be disposed in or over the opening 38. In the example of FIG. 1, the obstruction 40 is configured as a plug within the opening 38. In other embodiments, the obstruction 40 is configured as a film, layer, or other object that extends over or otherwise covers the opening 38. An example of a covering obstruction is shown and described in connection with FIG. 5.

The obstruction 40 may or may not seal the second cavity 30. The seal may be semi-hermetic. For example, the obstruction 40 may include an epoxy material that sufficiently seals the opening 38 to block or otherwise prevent solid particles from entering the second cavity 30. The protection may be useful during subsequent fabrication and/or assembly procedures in which contaminants are generated. For example, the obstruction 40 may block saw slurry from entering the second cavity 30 during a dicing procedure. Other contaminants may be blocked by the obstruction 40, including, for instance, ambient (e.g., gaseous) materials at an assembly site. For example, the obstruction 40 may block outgasses generated during bonding procedures. Alternatively or additionally, the obstruction 40 may protect the sensors 34 in the second cavity 30 from contaminants during movement of the sensor device 20 to an assembly and/or packaging site. The obstruction 40 may thus provide a temporary or interim seal of the opening 38.

As shown in FIG. 1, the obstruction 40 may continue to obstruct the opening 38 during and after the attachment of the ASIC die 26 and the cap die 24. The obstruction 40 may thus protect the sensors 34 from outgasses generated during attachment of the cap die 24 and the ASIC die 26. In other embodiments, the obstruction 40 is removed before attachment of the ASIC die 26. For example, the obstruction 40 may be removed after dicing the wafers to define the intermediate or interim die stack including the sensor die 22 and the cap die 24. Dicing may occur after wafer-level attachment of the ASIC die 26 in other embodiments.

Various materials may be used to form the obstruction 40. The obstruction 40 may include one or more epoxy materials. For example, the obstruction 40 may include EP937 commercially available from Lord Corporation, or FP4460 commercially available from Henkel AG. In some cases, the epoxy material may provide a semi-hermetic seal. Non-epoxy materials may be used as the obstruction 40.

The attachment of the cap die 24 and the ASIC die 26 seals the second cavity 30. The seal is provided by a seal ring 42 that surrounds the opening 38. The seal may be both hermetic and permanent, unlike the seal provided by the obstruction 40 in some embodiments. The seal ring 42 may be formed with a bonding material used to attach the cap die 24 and the ASIC die 26. Alternatively, the seal ring 42 is formed with a material other than the bonding material used to attach the cap die 24 and the ASIC die 26. Further details regarding exemplary bonding materials used to attach the die 22, 24, 26 are provided below. In some cases, the seal ring 42 provides an electrical connection between the die 24 and 26.

One or more of the die 22, 24, 26 may include a number of through silicon vias (TSVs) to establish electrical connections with the sensors 32, 34. The number of TSVs in each die may vary from the example shown. In the example of FIG. 1, the sensor die 22 includes TSVs 44, 46 for carrying signals or otherwise establishing electrical connections between the side 36 of the sensor die 22 and an opposite side 47 (or backside) thereof. The TSVs 44, 46 are shown schematically, and the number, positioning, and other characteristics of the TSVs may vary. The TSVs 44, 46 may allow packaging techniques other than wire bonding to be used. In other embodiments, wire bonding may be used, in which case the TSVs 44, 46 may not be provided.

The cap die 24 includes TSVs 48, 50 to establish electrical connections between the sensor die 22 and the ASIC die 26. The ASIC die 26 includes TSVs 52, 54 to establish electrical connections between circuitry on a side opposite to the side facing the cap die 24. The TSVs 48, 50, 52, 54 are shown schematically, and the number, positioning, and other characteristics of TSVs may vary. The die 22, 24, 26 may include one or more metal layers of redistribution circuitry (not shown) coupled to the TSVs to facilitate the electrical connections.

Electrical and physical connections between the die 22, 24, 26 are established via respective die bond arrangements. In the embodiment of FIG. 1, a die bond arrangement between the sensor die 22 and the cap die 24 includes a sealing ring 56, a partition line 58, and a number of signal bumps 60. The sealing ring 56 may extend along an outer periphery of the die 22, 24. The partition line 58 may divide the first and second cavities 28, 30 from one another.

The die bond arrangement between the cap die 24 and the ASIC die 26 includes the sealing ring 42 and a number of metal bumps 62. One or more of the metal bumps 62 may carry signals or establish other electrical connections. The sealing ring 42 may also carry a signal or establish another electrical connection.

A first bond material is used to attach the sensor and cap die 22, 24 in the embodiments described herein. The first bond material may be or include an alloy of aluminum-germanium (Al—Ge). The first bond material may attach the sensor and cap die 22, 24 via a eutectic bond that forms at a high bonding temperature not reached in subsequent bonding or assembly processes. The first bond material may thus constitute the top of a solder hierarchy for the sensor devices of the disclosed embodiments. For example, the bonding temperature of the first bond material may be about 470° C., although it may be higher or lower, as well. Other present or future developed alloys having such high bonding temperatures may be used as the first bond material.

A second bond material is used to attach the cap die 24 with the ASIC die 26 (or other die) used to seal the cavity 30 vented by the opening 38. The second bond material has a bonding temperature lower than the high bonding temperature of the first bond material. The second bond material may be or include a tin-based solder. For example, the second bond material may be a tin-silver alloy, such as a tin-silver-copper (SnAgCu) alloy. The bonding temperature of the second bond material may thus be about 230-250° C., although it may be higher or lower, as well. Other tin-based or tin-silver solders may be used, such as tin-antimony (SnSb), high lead (Pb) solders (e.g., PbSn and PbSnAg). Other present or future developed solders may be used as the second bond material.

The above-described die may be formed from respective semiconductor wafers. Each die may thus include a semiconductor substrate. A variety of semiconductor materials may be used, including elementary semiconductors, such as silicon (Si), and compound semiconductors, such as gallium arsenide (GaAs) and gallium nitride (GaN). Other compound and non-compound semiconductor materials may be used. The substrate may be a bulk semiconductor wafer. Other types of semiconductor substrates may be used. For example, one or more of the substrates may be configured as a semiconductor-on-insulator (SOI) substrate. In some cases, the substrate is a composite substrate with any number of layers (e.g., a base layer and one or more epitaxial layers). For example, the substrate may include an original semiconductor substrate on which the insulator, epitaxial, or other layers are grown or otherwise formed. Alternatively or additionally, the substrate may include non-semiconductor materials. The above-described substrates need not be configured similarly. For example, one of the cap substrates may be a glass or other dielectric substrate, while the other cap substrate and the sensor substrate are semiconductor substrates (e.g., silicon substrates or compound substrates).

Figure 2:
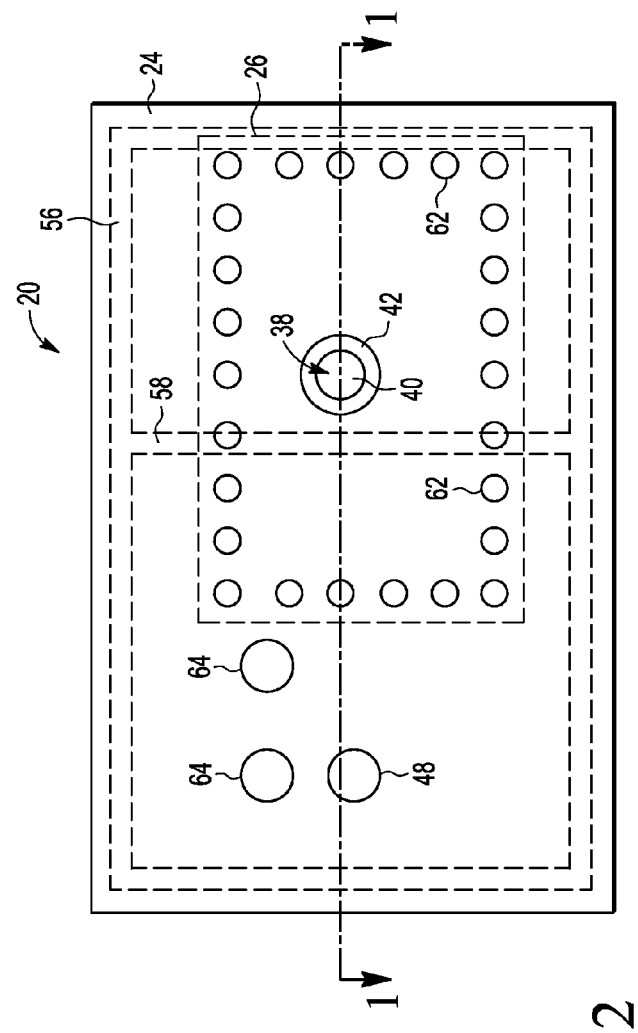
FIG. 2 is a schematic, simplified, plan view of the sensor device of FIG. 1.

FIG. 2 is a plan view of the sensor device 20 with the ASIC die 26 shown in phantom. FIG. 2 depicts the obstruction 40, the seal ring 42, and the die bond arrangements of the sensor device 20 in greater detail. In this embodiment, the seal ring 42 runs along a perimeter of the opening 38. In other cases, the seal ring 42 is not adjacent to the opening 38. The seal ring 42 may thus be spaced from the opening 38. The seal ring 42 may have a variety of different arrangements. For example, the seal ring 42 may be disposed in a ring that runs along a perimeter of the ASIC die 26 and/or, in other embodiments, the cap die 24. In some cases, the seal area may be circular or otherwise shaped, and is not limited to ring-shaped areas.

In this embodiment, the obstruction 40 matches the size and shape of the opening 38. In other cases, the obstruction 40 may extend beyond the opening 38. One example is described below in connection with FIG. 5.

The metal bumps 62 are disposed in a ring-shaped arrangement in this embodiment. Alternative or additional arrangements may be used. For example, a number of the metal bumps 62 may be distributed throughout the interior of the ASIC die 26. The spacing between the seal ring 42 and the metal bumps 62 may vary from the example shown.

The cap die 24 includes further TSVs 64 adjacent to the TSV 48. The TSV 50 is not shown in FIG. 2 for ease in illustration. The positioning and other characteristics of the TSVs 48, 50, 64 may vary from the example shown. One or more distribution circuits may be disposed on the cap die 24 to couple the TSVs 48, 50, 64 to assembly solder bumps, wire bond pads, and/or other structures.

The partition line 58 connects opposite sides of the sealing ring 56 connecting the sensor die 22 and the cap die 24. The signal bump(s) 60 are not shown in the plan view for ease in illustration. In alternative embodiments, the sensor die 22 and the cap die 24 may be attached by bumps and other structures in addition to the sealing ring 56, the partition line 58, and the signal bump(s) 60.

Figure 3:
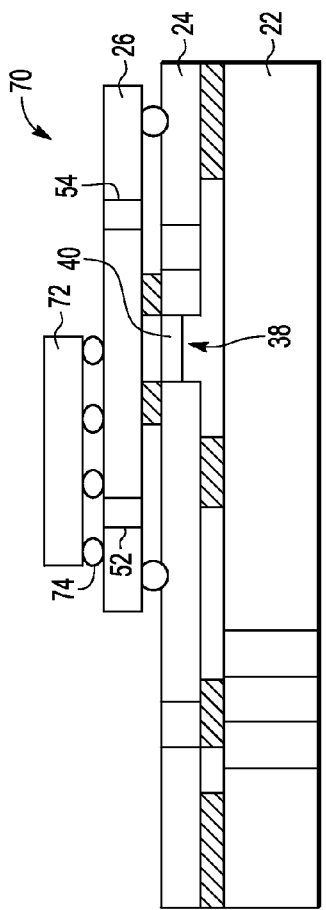
FIG. 3 is a schematic, simplified, sectional view of another sensor device having an obstructed vent hole in accordance with one embodiment.

FIG. 3 depicts a sensor device 70 having an alternative die stack. The die stack may include sensor, cap, and ASIC die 22, 24, 26 as described above. The sensor device 70 includes another die 72 attached to the outward side of the ASIC die 26. In some cases, the die 72 is a magnetic sensor die. For example, three magnetic sensors may be formed on the die 72 to provide a total nine degrees of freedom or data, three from each type of sensor. Other types of sensors and/or circuits may be disposed on the die 72. In this example, the die 72 is attached to the ASIC die 26 with a number of solder bumps 74. The solder bumps or other bonding structures may be made of, or include, a tin-antimony (Sn—Sb) alloy. The alloy may have a slightly lower melt point than the bonding material used to attach the cap die 24 and the ASIC die 26. In other cases, the same binding material may be used to attach the cap and ASIC die 24, 26, and the ASIC 26 and the die 72. The ASIC die 26 and the die 72 may be assembled with two reflow procedures, or with only a single procedure. The die 72 may be otherwise attached to the ASIC die 26. For example, the die 72 may be attached using an epoxy die attach technique, in which case wire bonds may be used for connections to the die 72. In such and other cases, wire bonds may be used to establish connections rather than TSV connections. A saw procedure may be used to expose bond pads for the wire bonds. The disclosed embodiments may accordingly use packaging techniques other than chip-scale packaging techniques.

The ASIC die 26 may include one or more circuits for controlling the magnetic or other sensors on the die 72. One or more redistribution circuits (not shown) on the ASIC die 26 may electrically connect some of the solder bumps 74 to the TSVs 52, 54 of the ASIC die 26.

In the embodiment of FIG. 3, the sensor, cap, and ASIC die 22, 24, 26 may be configured as described above. For instance, the opening 38 may be obstructed with a plug or other obstruction 40 as described above.

Figure 4:
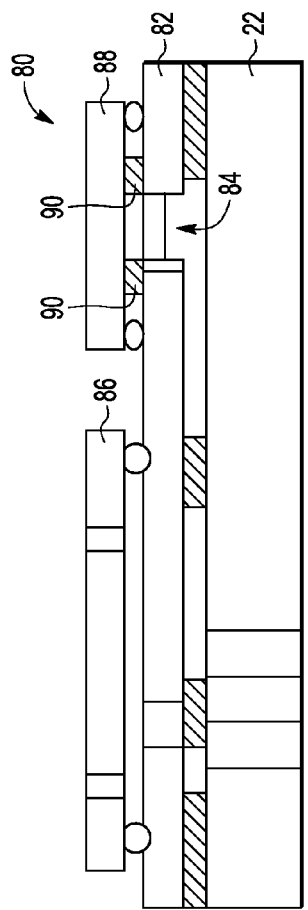
FIG. 4 is a schematic, simplified, cross-sectional view of yet another sensor device having an obstructed vent hole in accordance with one embodiment.

FIG. 4 depicts a sensor device 80 having another alternative die stack. The die stack may include a sensor die 22 as described above. The device cavities for the sensors on the sensor die 22 are defined by a cap die 82 that has an opening 84. The cap die 82 may be configured similarly to the cap die described above, except that the opening 84 may be positioned differently to accommodate a side-by-side arrangement of die attached to the cap die 82. Instead of being stacked as shown in the embodiment of FIG. 3, both an ASIC die 86 and a further sensor die 88 are attached to the ASIC die 82. The placement of the ASIC die 86 next to the sensor die 88 may allow the sensor device 80 to have a shorter or smaller profile.

The opening 84 may be shifted to a position that allows the sensor(s) on the sensor die 88 to be aligned with the sensor(s) on the sensor die 22. Angular alignment may be useful when accelerometers on the sensor die 22 are aligned with magnetic sensors on the sensor die 88. In this embodiment, the sensor die 88 has a seal ring 90 that seals the vented cavity. In other embodiments, the positions of the ASIC and sensor die 86, 88 are swapped such that the ASIC die 86 carriers a seal ring.

Figure 5:
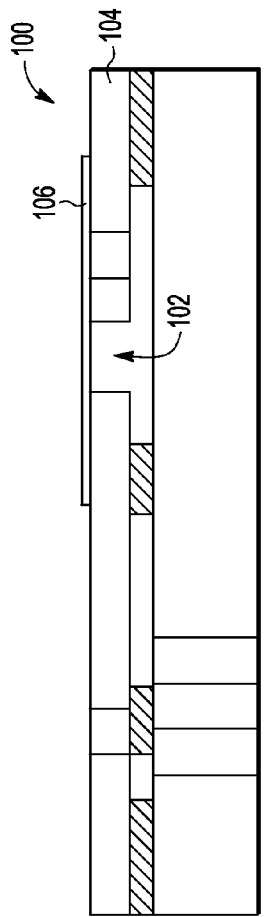
FIG. 5 is a schematic, simplified, cross-sectional view of still another sensor device having an obstructed vent hole in accordance with one embodiment.

FIG. 5 depicts a portion of a sensor device 100 configured in accordance with an embodiment in which an opening or vent hole 102 in a cap die 104 is obstructed by a film 106 rather than a plug as described above. The film 106 extends beyond the opening 102 to a certain extent that does not interfere with the attachment (e.g., bonding) of an ASIC or other die (not shown) that seals the cavity vented by the opening 102. The film 106 may be patterned or otherwise configured such that bonding locations on the cap die 104 are not covered by the film 106.

The film 106 may include one or more layers of various materials. In one embodiment, the film 106 is deposited as a tape. The film 106 may include a Kapton® polyimide film, but other materials may be used, including for example, Riston photoresist film, which is commercially available from E. I. du Pont de Nemours and Company (DuPont), and which may be patterned after blanket application.

The location of the circuitry used to control or interact with the sensors of the above-described sensor devices may vary from the examples shown. For example, such circuitry may be located on a cap die. The circuitry may alternatively or additionally be distributed over multiple die, rather than being limited to a single ASIC die. The location of the one or more ASIC die may also vary from the examples shown.

Figure 6:
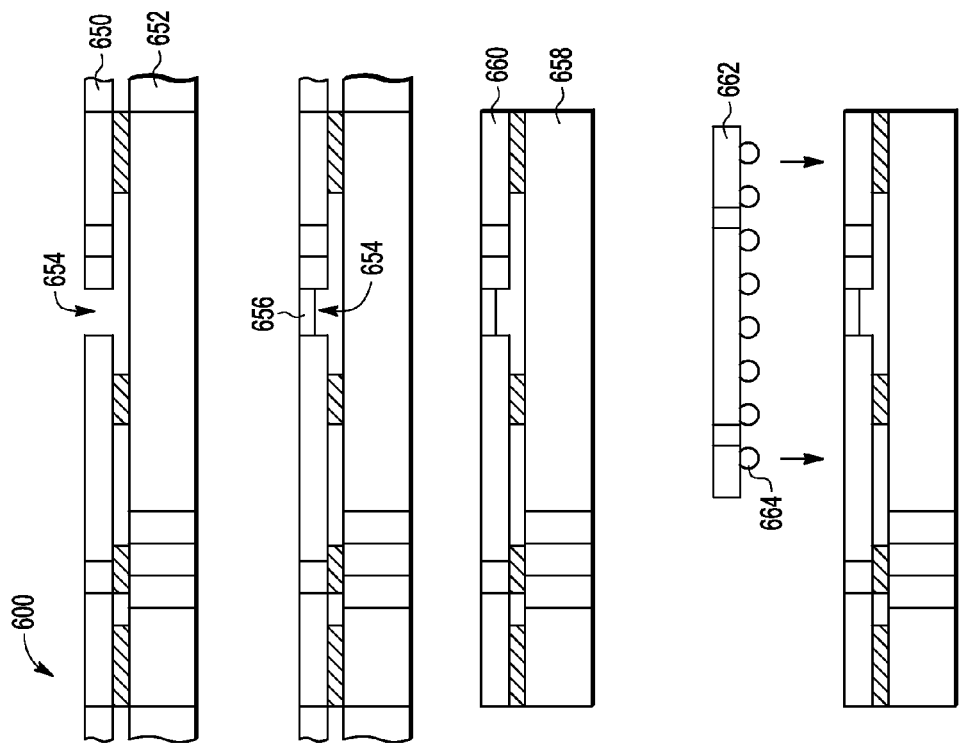
FIG. 6 is a flow diagram of an exemplary method of fabricating a sensor device in which a vent hole is obstructed in accordance with one embodiment.
Figure 6:
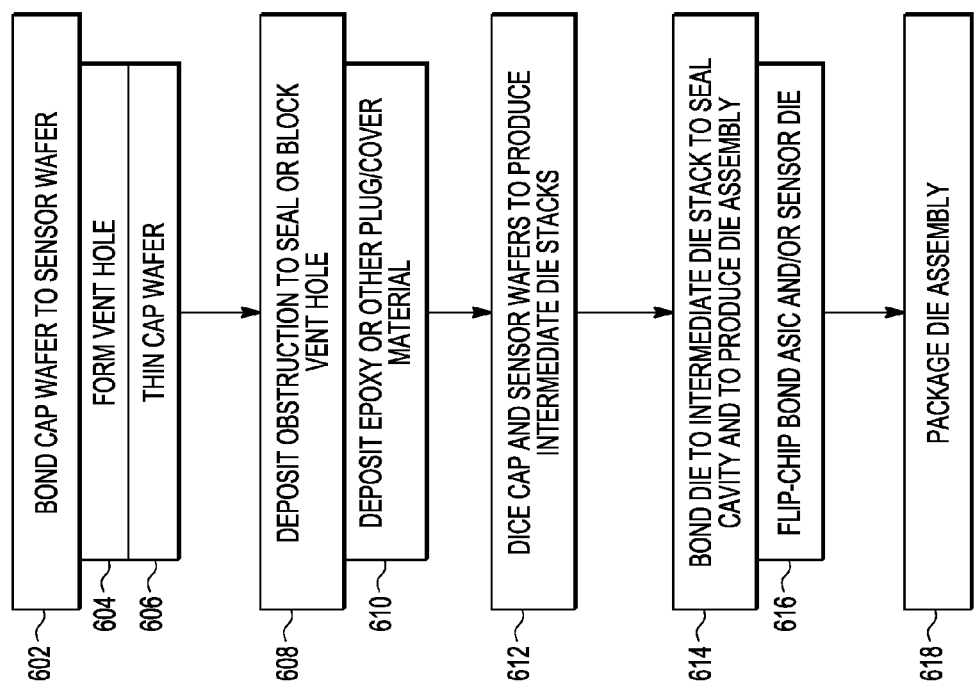

FIG. 6 depicts a method 600 of fabricating a sensor device, such as the sensor devices described above. The fabrication method 600 is configured to prevent damage to sensors that would otherwise be exposed during subsequent fabrication and/or assembly procedures. The fabrication method 600 includes the obstruction of an opening or vent hole relied upon to allow different pressure levels to be established for different device cavities. The method 600 includes a sequence of acts or steps, only the salient of which are depicted for convenience in illustration. Additional, fewer, or alternative acts or steps may be implemented. For example, additional fabrication acts or steps may be implemented, including, for instance, acts directed to attaching a magnetic sensor die to incorporate further sensor technologies into the sensor device.

The method 600 may begin with, or include, a number of acts in which device structures are formed in sensor and cap substrates. The device structures may be configured to define a number of transistor or other devices in circuitry formed in and/or on a substrate of a cap wafer. For example, each die of the cap wafer may include an ASIC. In some cases, the circuitry is formed in the substrates of multiple cap wafers. Other device structures may be configured as sensors formed in and/or supported by a substrate of a sensor wafer. For example, each die on the sensor wafer may include one or more MEMS accelerometers, one or more MEMS gyroscopes, and/or one or more other types of sensors or other devices. Other device structures may include one or more redistribution layers to support electrical connections between the circuits or devices disposed on the respective substrates.

In an act 602, a cap wafer 650 is bonded or attached to a sensor wafer 652. The attachment defines multiple cavities in which the sensors on the sensor wafer 652 are disposed. In other embodiments, the cap wafer 650 and the sensor wafer 652 are reversed. The attachment of the cap and sensor wafers 650, 652 may use a first bond material. The first bond material may include an Al—Ge alloy or other material having a high or other bonding temperature not subsequently reached during fabrication or assembly. Each of the cap wafer 650 and the sensor wafer 652 includes a plurality of die, one of which is demarcated by die scribe lines for ease in illustration in the cutaway views depicted in FIG. 6. The first bond material is arranged to define and hermetically seal a first device cavity for each die of the plurality of die. For example, the first bond material may be arranged in a seal ring having a cavity partition line as described above. The act 600 may be implemented at a pressure such that the sensor disposed in the first cavity operates at a suitable pressure level, such as a high vacuum pressure level.

In some embodiments, an opening or vent hole 654 is formed in an act 604 in each die of the cap wafer 650 to allow a different pressure level to be established in a second cavity of the sensor device. Alternatively, the vent hole 654 is formed before the attachment of the cap wafer 650. The opening 654 is in communication with a second cavity defined by the attachment of the cap and sensor wafers 650, 652.

One or both of the cap wafer 650 and the sensor wafer 652 may be thinned in an act 606 via, for example, a backgrinding process, after the attachment. In some cases, one or both of the wafers 650, 652 are only partially thinned at this point, or not thinned until a subsequent point, if, for instance, a thicker wafer may be useful for handling In an act 608, the opening 654 is obstructed. In this example, an obstruction 656 is deposited to seal or block the opening 654. In some embodiments, the act 608 includes depositing or otherwise forming a plug in the opening 654. In other cases, the act 608 includes forming or depositing a film or other layer that covers the opening 654. An epoxy or other material may be deposited in an act 610 to fill and/or cover the opening 654.

The cap and sensor wafers 650, 652 are diced in an act 612 to form an intermediate or interim die stack including a sensor die 658 and a cap die 660. The dicing may include sawing the wafers along scribe lines. The manner in which the sensor and cap wafers are diced may vary. During the dicing, the obstruction 656 protects the device components in the cavity vented by the opening 654. The protection may also be provided while the die stack is transported from a fabrication facility to an assembly facility.

In an act 614, an ASIC die 662 is attached to the intermediate die stack. The ASIC die 662 is attached to the cap die 660. The attachment of the ASIC die 662 hermetically seals the cavity vented by the opening, as described above. The ASIC die 662 may be bonded or attached to the sensor wafer with a second bond material. The second bond material has a lower bonding temperature than the first bond material, as described above. For example, the second bond material may be a Pb-free solder, such as a tin-silver-based solder, or the second bond material may be another material. As described above, the second bond material may be provided as a number of solder bumps 664.

The second bond material may also be arranged in a seal ring that surrounds the opening. For example, the seal ring may be adjacent the opening. In other embodiments, the seal ring is formed from a material other than the solder bumps, such as a hermetic or near-hermetic epoxy material. The seal ring may alternatively include a copper pillar structure.

The act 614 may include an act 616 flip-chip bonding the ASIC die 662 to the intermediate die stack to provide a multiple die assembly. In some embodiments, the flip-chip bonding may be implemented at the wafer level, i.e., before the dicing of the act 612.

Other types of metallization may be used for the die attachment in the act 614. For example, copper-to-copper or gold-tin bonds may be used. With these and other bonds, the lack of outgasses may allow the obstruction 656 to be removed.

Non-metal materials may also be used for the die attachment in the act 614. For example, an epoxy material that provides a sufficiently hermetic seal may be used. In such cases, the ASIC die 662 may be attached with the active side facing upward, i.e., not in a flip-chip arrangement. Wire bonds may be used for electrical connectivity.

Alternative embodiments of the method 600 may include the attachment of another sensor die. The sensor die may be in addition or alternative to the ASIC die 662. For instance, the act 614 may include bonding another die to the intermediate die stack or to the ASIC die 662. In other cases, the ASIC die 662 is replaced by the additional sensor die, with the ASIC provided via the cap die 660. A variety of die assemblies may be provided.

The multiple die assembly is packaged in an act 618. Various package assembly procedures may be used due to the protection by the obstruction 656. For example, a chip-scale packaging procedure may be used. The assembly may be packaged via land grid array (LGA) or quad flat no leads (QFN) techniques. Other packages and packaging techniques may be used. For example, one or more of the die may be wire bonded to a lead frame or a substrate. In some wire bond cases, one or more of the TSVs of the above-described embodiments may not be included.

The order of the acts described above may vary. For example, the openings in the cap wafer may be completely or partially formed before the cap and sensor wafers are attached to one another.

The embodiments described above support the combination of different types of sensors, e.g., MEMS sensors, such as gyroscopes and accelerometers, onto a single combination die, e.g., in a side-by-side arrangement. The disclosed embodiments establish respective cavities for the different sensor types to achieve a dual pressure combination die. The cavities provide respective pressure levels for the different sensor types through an opening or vent hole in one of the die. For instance, a gyroscope may be sealed at or near vacuum in one cavity, and an accelerometer may be sealed in another cavity vented by the opening. The combination die provides such dual pressure functionality in a smaller footprint and smaller thickness. The disclosed sensor devices may be assembled partially or fully at the wafer level.

The opening is plugged, filled, or otherwise obstructed to protect the sensor in the cavity vented by the opening. The obstruction may provide interim protection for the sensor, e.g., during subsequent fabrication and/or assembly procedures. The opening is then hermetically sealed at a later step in the assembly, such as the attachment, e.g., flip-chip attachment, of a third die. In some embodiments, the third die is an ASIC die. In other embodiments, e.g., if the ASIC die is used as a cap, then the third die may include another sensor, e.g., a magnetic sensor. In some cases, an ASIC die and a magnetic sensor die may be mounted side-by-side, with one of the die establishing the hermetic seal for the cavity with the opening. The use of a magnetic sensor die to provide the hermetic seal may align the magnetic sensor and an accelerometer in the cavity with the opening. Such alignment may be useful in some cases.

In one aspect, a method of fabricating a sensor device includes attaching first and second die to one another to define first and second cavities in which first and second sensors of the sensor device are disposed, respectively, the second die having an opening in communication with the second cavity, obstructing the opening, and attaching a third die to the second die. The first cavity is hermetically sealed by attaching the first and second die, and the second cavity is hermetically sealed by attaching the third die to the second die.

In a second aspect, a method of fabricating a sensor device includes attaching first and second wafers to one another to define first and second cavities in which first and second sensors of the sensor device are disposed, respectively, the second wafer having a vent hole in communication with the second cavity, depositing an obstruction on the second wafer to obstruct the opening, and attaching a die over the second cavity to hermetically seal the second cavity with the opening remaining obstructed by the obstruction.

In a third aspect, a sensor device includes a first die, a second die attached to the first die to define first and second cavities in which first and second sensors are disposed, respectively, the second die having an opening in communication with the second cavity, an obstruction disposed relative to the opening to obstruct the opening, and a third die attached to the second die to seal the second cavity.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method of fabricating a sensor device, the method comprising:
    attaching first and second die to one another to define first and second cavities in which first and second sensors of the sensor device are disposed, respectively, the second die having an opening in communication with the second cavity;
    obstructing the opening; and
    attaching a third die to the second die;
    wherein the first cavity is hermetically sealed by attaching the first and second die; and
    wherein the second cavity is hermetically sealed by attaching the third die to the second die.

2. The method of claim 1, wherein obstructing the opening comprises depositing a plug in the opening.

3. The method of claim 2, wherein the plug comprises an epoxy material.

4. The method of claim 2, wherein:
    attaching the first and second die comprises attaching first and second wafers comprising the first and second die, respectively;
    depositing the plug is performed after attaching the first and second wafers; and
    the method further comprises dicing the first and second wafers to form a die stack comprising the first and second sensors.

5. The method of claim 1, wherein obstructing the opening comprises depositing a film on the second die to cover the opening.

6. The method of claim 5, wherein:
    attaching the first and second die comprises attaching first and second wafers comprising the first and second die, respectively;
    depositing the film is performed after attaching the first and second wafers; and
    the method further comprises dicing the first and second wafers to form a die stack comprising the first and second sensors.

7. The method of claim 1, wherein:
    the first and second sensors are disposed on the first die; and
    the second die is configured as a cap die.

8. The method of claim 1, wherein the third die comprises an application-specific integrated circuit (ASIC).

9. The method of claim 1, wherein the third die comprises a third sensor.

10. The method of claim 1, further comprising attaching a further die to the second die.

11. The method of claim 1, further comprising attaching a further die to the third die.

12. A method of fabricating a sensor device, the method comprising:
    attaching first and second wafers to one another to define first and second cavities in which first and second sensors of the sensor device are disposed, respectively, the second wafer having a vent hole in communication with the second cavity;
    depositing an obstruction on the second wafer to obstruct the opening; and
    attaching a die over the second cavity to hermetically seal the second cavity with the opening remaining obstructed by the obstruction.

13. The method of claim 12, wherein depositing the obstruction comprises depositing a plug in the opening.

14. The method of claim 12, further comprising dicing the first and second wafers to form a die stack comprising the first and second sensors, wherein attaching the die comprises attaching the die to the die stack after dicing the first and second wafers.

15. The method of claim 12, wherein:
    the first and second sensors are disposed on the first wafer; and
    the second wafer is configured as a cap wafer.

16. A sensor device comprising:
    a first die;
    a second die attached to the first die to define first and second cavities in which first and second sensors are disposed, respectively, the second die having an opening in communication with the second cavity;
    an obstruction disposed relative to the opening to obstruct the opening; and
    a third die attached to the second die to seal the second cavity.

17. The sensor device of claim 16, wherein the third die is attached to the second die with a seal ring that surrounds the opening to hermetically seal the second cavity.

18. The sensor device of claim 16, wherein the obstruction comprises a plug in the opening.

19. The sensor device of claim 16, wherein the obstruction comprises a film on the second die covering the opening.

20. The sensor device of claim 16, wherein:
    the first cavity has a first pressure; and
    the second cavity has a second pressure higher than the first pressure.

* * * * *